(12) United States Patent
Gong

(10) Patent No.: US 9,875,706 B1
(45) Date of Patent: Jan. 23, 2018

(54) GOA CIRCUIT OF REDUCING FEED-THROUGH VOLTAGE

(71) Applicant: Wuhan China Star Optoelectronics Technology Co., Ltd., Wuhan (CN)

(72) Inventor: Qiang Gong, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 260 days.

(21) Appl. No.: 14/908,128

(22) PCT Filed: Dec. 28, 2015

(86) PCT No.: PCT/CN2015/099280
§ 371 (c)(1),
(2) Date: Jan. 28, 2016

(87) PCT Pub. No.: WO2017/092116
PCT Pub. Date: Jun. 8, 2017

(30) Foreign Application Priority Data

Dec. 4, 2015 (CN) .......................... 2015 1 0890334

(51) Int. Cl.
*G09G 3/36* (2006.01)
*G02F 1/1345* (2006.01)
*G02F 1/1362* (2006.01)

(52) U.S. Cl.
CPC ....... *G09G 3/3659* (2013.01); *G02F 1/13454* (2013.01); *G02F 1/136213* (2013.01); *G09G 3/3677* (2013.01); *G09G 2320/0219* (2013.01); *G09G 2320/0233* (2013.01)

(58) Field of Classification Search
CPC ......... G09G 3/3677; G09G 2300/0408; G09G 2310/0286; G09G 2310/08; G09G 2320/0219; G09G 2300/0417; G09G 2310/06; G09G 3/36; G09G 2310/0283; G09G 2320/0214; G02F 1/13454; G02F 1/136286; G02F 1/13306; G02F 1/13621
See application file for complete search history.

(56) References Cited

U.S. PATENT DOCUMENTS

| | | | |
|---|---|---|---|
| 9,190,170 B1* | 11/2015 | Hao | G09G 3/3677 |
| 9,318,218 B2* | 4/2016 | Wang | G11C 19/28 |
| 2014/0049712 A1* | 2/2014 | Yu | G02F 1/13306 349/34 |

* cited by examiner

*Primary Examiner* — Hong Zhou
(74) *Attorney, Agent, or Firm* — Leong C. Lei

(57) ABSTRACT

The present invention provides a GOA circuit of reducing feed-through voltage. An eleventh thin film transistor (T11) and a first capacitor (R1) coupled to the eleventh thin film transistor (T11) in series are added in a pull-down output unit (400). In the output process of the GOA circuit, the eleventh thin film transistor (T11) is activated with the added output control signal (CKF). With the voltage division function of the first resistor (R1), one more falling edge is generated to the waveform outputted by the output end (G(n)). Namely, the waveform outputted by the output end (G(n)) comprises two falling edges. Thereby, the voltage difference before and after the gate of the TFT in the pixel can be decreased to reduce the feed-through voltage and raise the display uniformity of the liquid crystal panel.

17 Claims, 6 Drawing Sheets

GOA CIRCUIT OF REDUCING FEED-THROUGH VOLTAGE

FIELD OF THE INVENTION

The present invention relates to a display technology field, and more particularly to a GOA circuit of reducing feed-through voltage.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

The GOA technology, i.e. the Gate Driver on Array technology utilizes the original array manufacture processes of the liquid crystal display panel to manufacture the driving circuit of the level scan lines on the substrate around the active area, to replace the external Integrated Circuit (IC) for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

FIG. 1 shows a common GOA circuit according to prior art, comprising a plurality of GOA units which are cascade coupled. n is set to be a positive integer, and the GOA unit of the nth stage comprises: a first thin film transistor T1, and a gate of the first thin film transistor T1 is electrically coupled to a forward scan control signal U2D, and a source is electrically coupled to an output end G(n−1) of a n−1th GOA unit of the former stage, and a drain is electrically coupled to a source of a third thin film transistor T3; and a second thin film transistor T2, a gate of the second thin film transistor T2 is electrically coupled to a backward scan control signal D2U, and a source is electrically coupled to an output end G(n+1) of a n+1th GOA unit of the latter stage, and a drain is electrically coupled to the source of the third thin film transistor T3; the third thin film transistor T3, and a gate of the third thin film transistor T3 is electrically coupled to a first clock signal CK(1), and a drain is electrically coupled to a gate of a fourth thin film transistor T4; the fourth thin film transistor T4, and a gate of the fourth thin film transistor T4 is electrically coupled to a source of a seventh thin film transistor T7, and a drain is electrically coupled to a second node P(n), and a source is electrically coupled to the first clock signal CK(1); a fifth thin film transistor T5, and a gate of the fifth thin film transistor T5 is electrically coupled to the first clock signal CK(1), and a drain is electrically coupled to the second node P(n), and a source is electrically coupled to a constant high voltage level VGH; a sixth thin film transistor T6, and a gate of the thin film transistor T6 is electrically coupled to the second node P(n), and a source is electrically coupled to a drain of the seventh thin film transistor T7, and a drain is electrically coupled to a constant low voltage level VGL; the seventh thin film transistor T7, and a gate of the seventh thin film transistor T7 is electrically coupled to a second clock signal CK(2), and a source is electrically coupled to a source of an eighth thin film transistor T8; the eighth thin film transistor T8, and a gate of the eighth thin film transistor T8 is electrically coupled to the constant high voltage level VGH, and a drain is electrically coupled to a first node Q(n); a ninth thin film transistor T9, and a gate of the thin film transistor T9 is electrically coupled to the first node Q(n), and a source is electrically coupled to the second clock signal CK(n), and a drain is electrically coupled to an output end G(n); a tenth thin film transistor T10, and a gate of the tenth thin film transistor T10 is electrically coupled to the second node P(n), and a drain is electrically coupled to the output end G(n), and a source is electrically coupled to the constant low voltage level VGL; a first capacitor C1, and one end of the first capacitor C1 is electrically coupled to the first node Q(n), and the other end is electrically coupled to the output end G(n); a second capacitor C2, and one end of the second capacitor C2 is electrically coupled to the second node P(n), and the other end is electrically coupled to the constant low voltage level VGL.

Furthermore, the first thin film transistor T1 and the second thin film transistor T2 construct the forward-backward scan control unit 100 of the GOA unit; the ninth thin film transistor T9 and the first capacitor C1 construct the pull-up output unit 200 of the GOA unit, employed to output the high voltage level of the second clock signal CK(2) to the output end G(n), and the high voltage level of the second clock signal CK(2) and the constant high voltage level VGH are the same; the sixth, the seventh and the eighth thin film transistors T6, T7, T8 construct the first node pull-down unit 300 of the GOA circuit; the fourth thin film transistor T4, the fifth thin film transistor T5, the tenth thin film transistor T10 and the second capacitor C2 construct the pull-down output unit 400 of the GOA circuit, employed to make the output end G(n) output a low voltage equal to the constant low voltage level VGL. With combination of FIG. 2, the signal (G(1)-G(4) as shown in FIG. 2) outputted by the output end G(n) of the aforesaid GOA circuit is a pulse signal having only one falling edge, which is directly dropped from the constant high voltage level VGH to the constant low voltage level VGL.

In the general liquid crystal display, each pixel is electrically coupled to a thin film transistor (TFT), and the gate of the thin film transistor is coupled to a level scan line, and the drain is coupled to a vertical data line, and the source is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. After charging the pixel, the gate of the TFT is off, the Feed through phenomenon due to the capacitor coupling between of the gate and the drain instantly as the gate of the TFT is off. Accordingly, a difference exists between the voltage charged in the pixel and the voltage on the data line. The voltage difference before and after the gate of the TFT is off, the caused feed-through voltage is larger. Although the voltage of the common electrode can be adjusted to compensate this difference, the deviation appears in the process, the larger the feed-through voltage is, the common voltage nonuniformity caused by the process deviation will be more obvious. Therefore, it has significant meanings to reduce the feed-through voltage as the pixel is charged for promoting the display uniformity of the display panel. At present, some of the external integrated circuit (Gate IC) employed for driving the gate can output the output signal waveform having two falling edges to reduce the feed-through voltage but it is not applicable for the GOA circuit. The GOA circuit according to prior art shown in FIG. 1 only can output the output signal having one falling edge. Before and after the gate of the TFT is off, the constant high voltage level VGH is directly dropped to the constant low voltage level VGL.

The feed-through voltage as the pixel is charged cannot be reduced, which is bad for promoting the display uniformity of the liquid crystal display panel.

SUMMARY OF THE INVENTION

An objective of the present invention is to provide a GOA circuit of reducing feed-through voltage, and the output end of the GOA circuit of reducing feed-through voltage can output a waveform comprising two falling edges, and thereby to reduce the feed-through voltage and raise the display uniformity of the liquid crystal panel.

For realizing the aforesaid objective, the present invention provides a GOA circuit of reducing feed-through voltage, comprising a plurality of GOA units, which are cascade coupled, and the GOA unit of each stage comprises: a forward-backward scan control unit, a pull-up output unit, a first node pull-down unit, a pull-down output unit and a third thin film transistor;

n is set to be a positive integer, and except the GOA unit of the first and last stages, in the GOA unit of the nth stage:

the forward-backward scan control unit comprises: a first thin film transistor, and a gate of the first thin film transistor is electrically coupled to a forward scan control signal, and a source is electrically coupled to an output end of a n−1th GOA unit of the former stage, and a drain is electrically coupled to a source of the third thin film transistor; and a second thin film transistor, a gate of the second thin film transistor is electrically coupled to a backward scan control signal, and a source is electrically coupled to an output end of a n+1th GOA unit of the latter stage;

a gate of the third thin film transistor is electrically coupled to a Mth clock signal, and the source is electrically coupled to the drain of the first thin film transistor and the drain of the second thin film transistor, and a drain is electrically coupled to a gate of a fourth thin film transistor;

the pull-up output unit comprises: a ninth thin film transistor, and a gate of the ninth thin film transistor is electrically coupled to a first node, and a source is electrically coupled to a M+1th clock signal, and a drain is electrically coupled to an output end; and a first capacitor, one end of the first capacitor is electrically coupled to the first node, and the other end is electrically coupled to the output end;

the pull-down output unit comprises: a fourth thin film transistor, and a gate of the fourth thin film transistor is electrically coupled to the drain of the third thin film transistor, and a drain is electrically coupled to a second node, and a source is electrically coupled to the Mth clock signal; a fifth thin film transistor, and a gate of the fifth thin film transistor is electrically coupled to the Mth clock signal, and a drain is electrically coupled to the second node, and a source is electrically coupled to a constant high voltage level; a tenth thin film transistor, and a gate of the tenth thin film transistor is electrically coupled to the second node, and a drain is electrically coupled to the output end, and a source is electrically coupled to a constant low voltage level; an eleventh thin film transistor, and a gate of the eleventh thin film transistor is electrically coupled to an output control signal, and a drain is electrically coupled to the output end, and a source is electrically coupled to one end of a first resistor; the first resistor, the other end of the first resistor is electrically coupled to the constant low voltage level, and a second capacitor, and one end of the second capacitor is electrically coupled to the second node, and the other end is electrically coupled to the constant low voltage level;

the first node pull-down unit comprises: a sixth thin film transistor, and a gate of the sixth thin film transistor is electrically coupled to the second node, and a source is electrically coupled to a drain of a seventh thin film transistor, and a drain is electrically coupled to the constant low voltage level; the seventh thin film transistor, and a gate of the seventh thin film transistor is electrically coupled to the M+1th clock signal, and a source is electrically coupled to the drain of the third thin film transistor, and a drain is electrically coupled to the source of the sixth thin film transistor; and an eighth thin film transistor, and a gate of the eighth thin film transistor is electrically coupled to the constant high voltage level, and a source is electrically coupled to the drain of the third thin film transistor, and a source is electrically coupled to the first node;

the output control signal is a pulse signal, of which a period is ½ of a clock signal period;

a signal waveform outputted by the output end comprises two falling edges.

In the GOA unit of the first stage, a source of the first thin film transistor is coupled to a circuit start signal.

In the GOA unit of the last stage, the source of the second thin film transistor is electrically coupled to a start signal.

As the forward scan control signal provides high voltage level, and the backward scan control signal provides low voltage level, the GOA circuit performs forward scan, and as the forward scan control signal provides low voltage level, and the backward scan control signal provides high voltage level, the GOA circuit performs backward scan.

The clock signal comprises two clock signals: a first clock signal and a second clock signal; as the Mth clock signal is the first clock signal, the M+1th clock signal is the second clock signal; as the Mth clock signal is the second clock signal, the M+1th clock signal is the first clock signal.

In one period of the output control signal, a rising edge of the output control signal is generated at a high voltage level phase of the M+1th clock signal, and a falling edge is generated simultaneously with a falling edge of the M+1th clock signal.

A high voltage level of the M+1th clock signal and a voltage level of the constant high voltage level are the same.

A voltage level of the first falling edge of a signal waveform outputted by the output end is dropped between the constant high voltage level and the constant low voltage level.

A channel width to length ratio of the eleventh thin film transistor and a resistance of the first resistor are adjusted to control a voltage level that the first falling edge of the signal waveform outputted by the output end drops to.

The thin film transistors are all N type LTPS semiconductor thin film transistors.

The present invention further provides a GOA circuit of reducing feed-through voltage, comprising a plurality of GOA units, which are cascade coupled, and the GOA unit of each stage comprises: a forward-backward scan control unit, a pull-up output unit, a first node pull-down unit, a pull-down output unit and a third thin film transistor;

n is set to be a positive integer, and except the GOA unit of the first and last stages, in the GOA unit of the nth stage:

the forward-backward scan control unit comprises: a first thin film transistor, and a gate of the first thin film transistor is electrically coupled to a forward scan control signal, and a source is electrically coupled to an output end of a n−1th GOA unit of the former stage, and a drain is electrically coupled to a source of the third thin film transistor; and a second thin film transistor, a gate of the second thin film transistor is electrically coupled to a backward scan control signal, and a source is electrically coupled to an output end of a n+1th GOA unit of the latter stage, and a drain is electrically coupled to the source of the third thin film transistor;

a gate of the third thin film transistor is electrically coupled to a Mth clock signal, and the source is electrically coupled to the drain of the first thin film transistor and the drain of the second thin film transistor, and a drain is electrically coupled to a gate of a fourth thin film transistor;

the pull-up output unit comprises: a ninth thin film transistor, and a gate of the ninth thin film transistor is electrically coupled to a first node, and a source is electrically coupled to a M+1th clock signal, and a drain is electrically coupled to an output end; and a first capacitor, one end of the first capacitor is electrically coupled to the first node, and the other end is electrically coupled to the output end;

the pull-down output unit comprises: a fourth thin film transistor, and a gate of the fourth thin film transistor is electrically coupled to the drain of the third thin film transistor, and a drain is electrically coupled to a second node, and a source is electrically coupled to the Mth clock signal; a fifth thin film transistor, and a gate of the fifth thin film transistor is electrically coupled to the Mth clock signal, and a drain is electrically coupled to the second node, and a source is electrically coupled to a constant high voltage level; a tenth thin film transistor, and a gate of the tenth thin film transistor is electrically coupled to the second node, and a drain is electrically coupled to the output end, and a source is electrically coupled to a constant low voltage level; an eleventh thin film transistor, and a gate of the eleventh thin film transistor is electrically coupled to an output control signal, and a drain is electrically coupled to the output end, and a source is electrically coupled to one end of a first resistor; the first resistor, the other end of the first resistor is electrically coupled to the constant low voltage level, and a second capacitor, and one end of the second capacitor is electrically coupled to the second node, and the other end is electrically coupled to the constant low voltage level;

the first node pull-down unit comprises: a sixth thin film transistor, and a gate of the sixth thin film transistor is electrically coupled to the second node, and a source is electrically coupled to a drain of a seventh thin film transistor, and a drain is electrically coupled to the constant low voltage level; the seventh thin film transistor, and a gate of the seventh thin film transistor is electrically coupled to the M+1th clock signal, and a source is electrically coupled to the drain of the third thin film transistor, and a drain is electrically coupled to the source of the sixth thin film transistor; and an eighth thin film transistor, and a gate of the eighth thin film transistor is electrically coupled to the constant high voltage level, and a source is electrically coupled to the drain of the third thin film transistor, and a source is electrically coupled to the first node;

the output control signal is a pulse signal, of which a period is ½ of a clock signal period;

a signal waveform outputted by the output end comprises two falling edges;

wherein in the GOA unit of the first stage, the source of the first thin film transistor is electrically coupled to a start signal;

wherein in the GOA unit of the last stage, the source of the second thin film transistor is electrically coupled to a start signal;

wherein as the forward scan control signal provides high voltage level, and the backward scan control signal provides low voltage level, the GOA circuit performs forward scan, and as the forward scan control signal provides low voltage level, and the backward scan control signal provides high voltage level, the GOA circuit performs backward scan.

The benefits of the present invention are: the present invention provides a GOA circuit of reducing feed-through voltage, and an eleventh thin film transistor and a first capacitor coupled to the eleventh thin film transistor in series are added in a pull-down output unit. In the output process of the GOA circuit, the eleventh thin film transistor is activated with the added output control signal. With the voltage division function of the first resistor, one more falling edge is generated to the waveform outputted by the output end. Namely, the waveform outputted by the output end comprises two falling edges. Thereby, the voltage difference before and after the gate of the TFT in the pixel can be decreased to reduce the feed-through voltage and raise the display uniformity of the liquid crystal panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
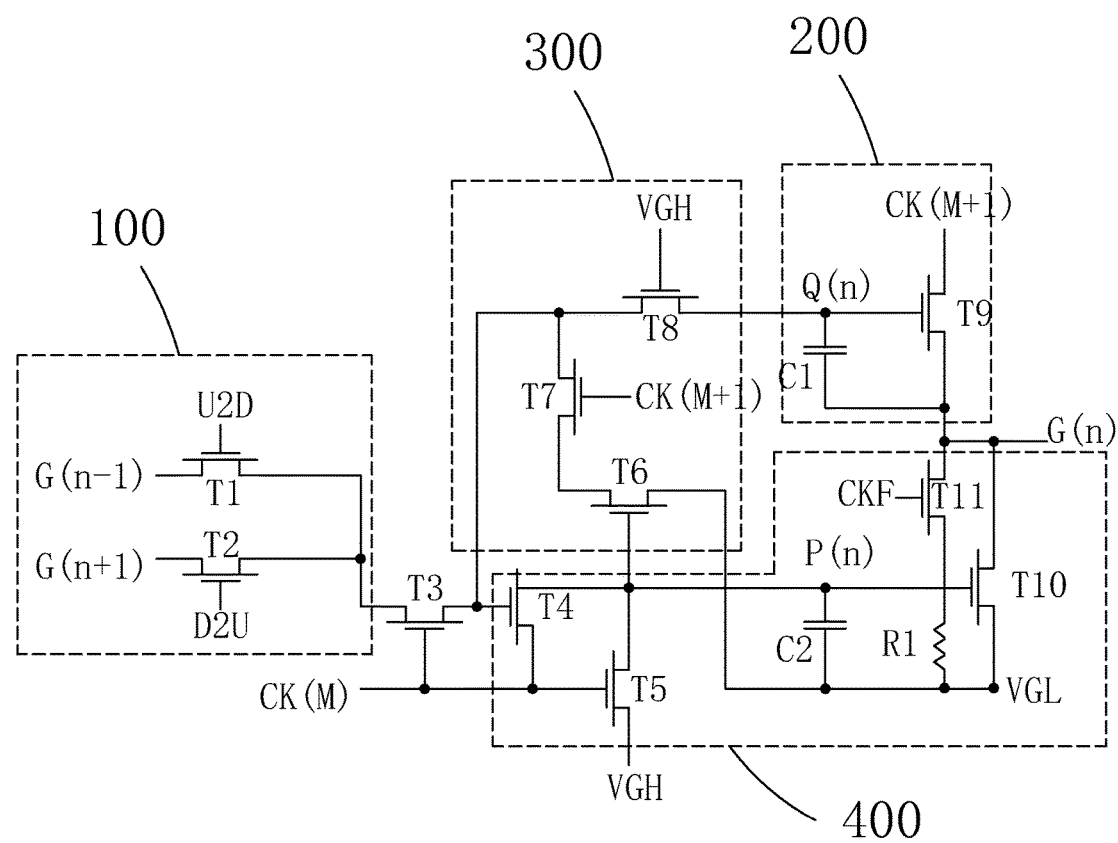
FIG. 3 is a circuit diagram of a GOA circuit of reducing feed-through voltage according to the present invention.
Figure 6:
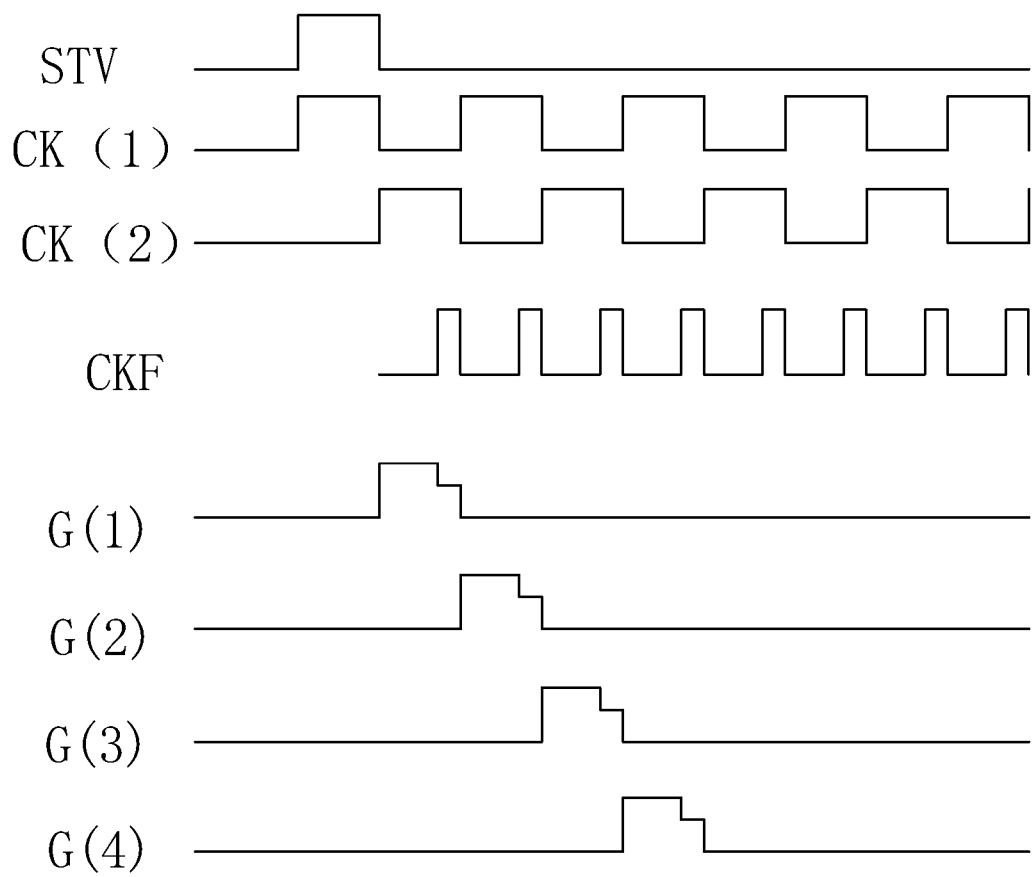
FIG. 6 is a forward scan sequence diagram of the GOA circuit of reducing feed-through voltage according to the present invention.

Please refer to FIG. 3 and FIG. 6 at the same time. The present invention first provides a GOA circuit of reducing feed-through voltage, comprising a plurality of GOA units, which are cascade coupled, and the GOA unit of each stage comprises: a forward-backward scan control unit 100, a pull-up output unit 200, a first node pull-down unit 300, a pull-down output unit 400 and a third thin film transistor T3.

n is set to be a positive integer, and except the GOA unit of the first and last stages, in the GOA unit of the nth stage:

the forward-backward scan control unit 100 comprises: a first thin film transistor T1, and a gate of the first thin film transistor T1 is electrically coupled to a forward scan control signal U2D, and a source is electrically coupled to an output end G(n−1) of a n−1th GOA unit of the former stage, and a drain is electrically coupled to a source of the third thin film transistor T3; and a second thin film transistor T2, a gate of the second thin film transistor T2 is electrically coupled to a backward scan control signal D2U, and a source is electrically coupled to an output end G(n+1) of a n+1th GOA unit of the latter stage, and a drain is electrically coupled to the source of the third thin film transistor T3;

the pull-up output unit 200 comprises: a ninth thin film transistor T9, and a gate of the ninth thin film transistor T9 is electrically coupled to a first node Q(n), and a source is electrically coupled to a M+1th clock signal CK(M+1), and a drain is electrically coupled to an output end G(n); and a first capacitor C1, one end of the first capacitor C1 is electrically coupled to the first node Q(n), and the other end is electrically coupled to the output end G(n);

the pull-down output unit 400 comprises: a fourth thin film transistor T4, and a gate of the fourth thin film transistor T4 is electrically coupled to the drain of the third thin film transistor T3, and a drain is electrically coupled to a second node P(n), and a source is electrically coupled to the Mth clock signal CK(M); a fifth thin film transistor T5, and a gate of the fifth thin film transistor T5 is electrically coupled to the Mth clock signal CK(M), and a drain is electrically coupled to the second node P(n), and a source is electrically coupled to a constant high voltage level VGH; a tenth thin film transistor T10, and a gate of the tenth thin film transistor T10 is electrically coupled to the second node P(n), and a drain is electrically coupled to the output end G(n), and a source is electrically coupled to a constant low voltage level VGL; an eleventh thin film transistor T11, and a gate of the eleventh thin film transistor T11 is electrically coupled to an output control signal CKF, and a drain is electrically coupled to the output end G(n), and a source is electrically coupled to one end of a first resistor R1; the first resistor R1, the other end of the first resistor R1 is electrically coupled to the constant low voltage level VGL, and a second capacitor C2, and one end of the second capacitor C2 is electrically coupled to the second node P(n), and the other end is electrically coupled to the constant low voltage level VGL;

the first node pull-down unit 300 comprises: a sixth thin film transistor T6, and a gate of the sixth thin film transistor T6 is electrically coupled to the second node P(n), and a source is electrically coupled to a drain of a seventh thin film transistor T7, and a drain is electrically coupled to the constant low voltage level VGL; the seventh thin film transistor T7, and a gate of the seventh thin film transistor T7 is electrically coupled to the M+1th clock signal CK(M+1), and a source is electrically coupled to the drain of the third thin film transistor T3, and a drain is electrically coupled to the source of the sixth thin film transistor T6; and an eighth thin film transistor T8, and a gate of the eighth thin film transistor T8 is electrically coupled to the constant high voltage level VGH, and a source is electrically coupled to the drain of the third thin film transistor T3, and a source is electrically coupled to the first node Q(n).

AS shown in FIG. 6, in the GOA circuit of the present invention, a signal waveform outputted by the output end G(n) can comprise two falling edges.

Figure 4:
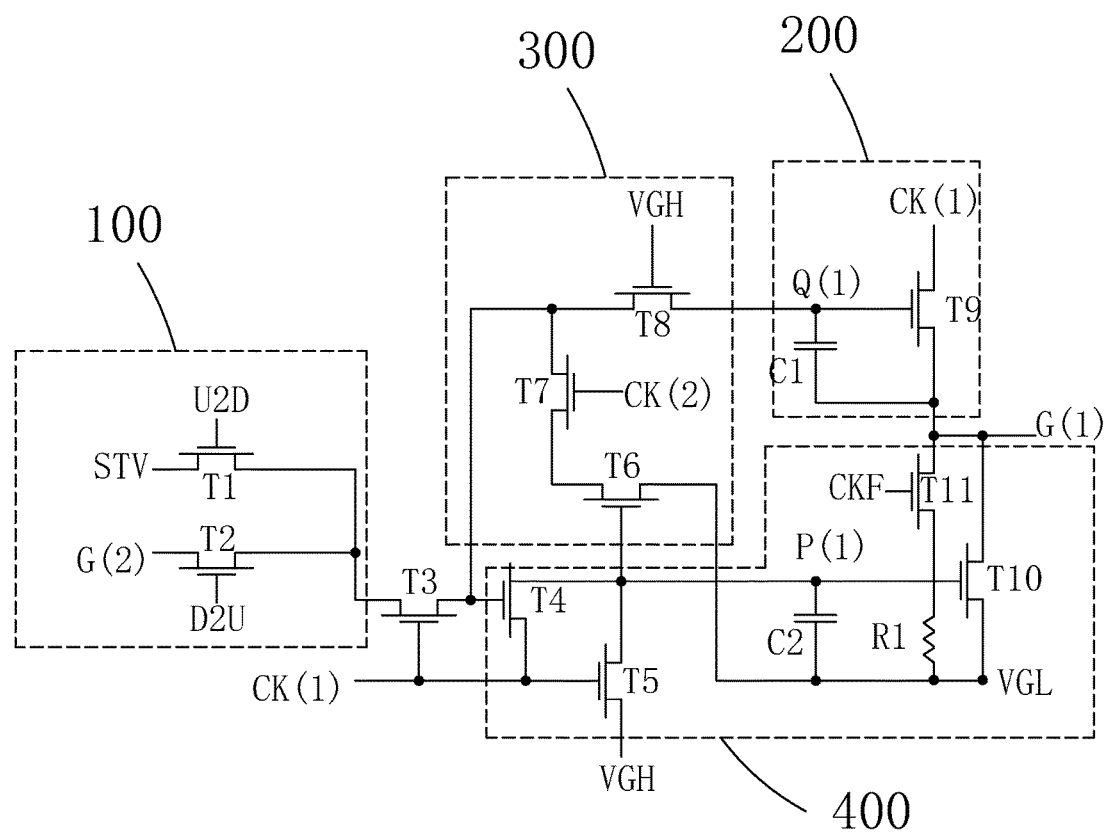
FIG. 4 is a circuit diagram of a GOA unit of the first stage in the GOA circuit of reducing feed-through voltage according to the present invention.
Figure 5:
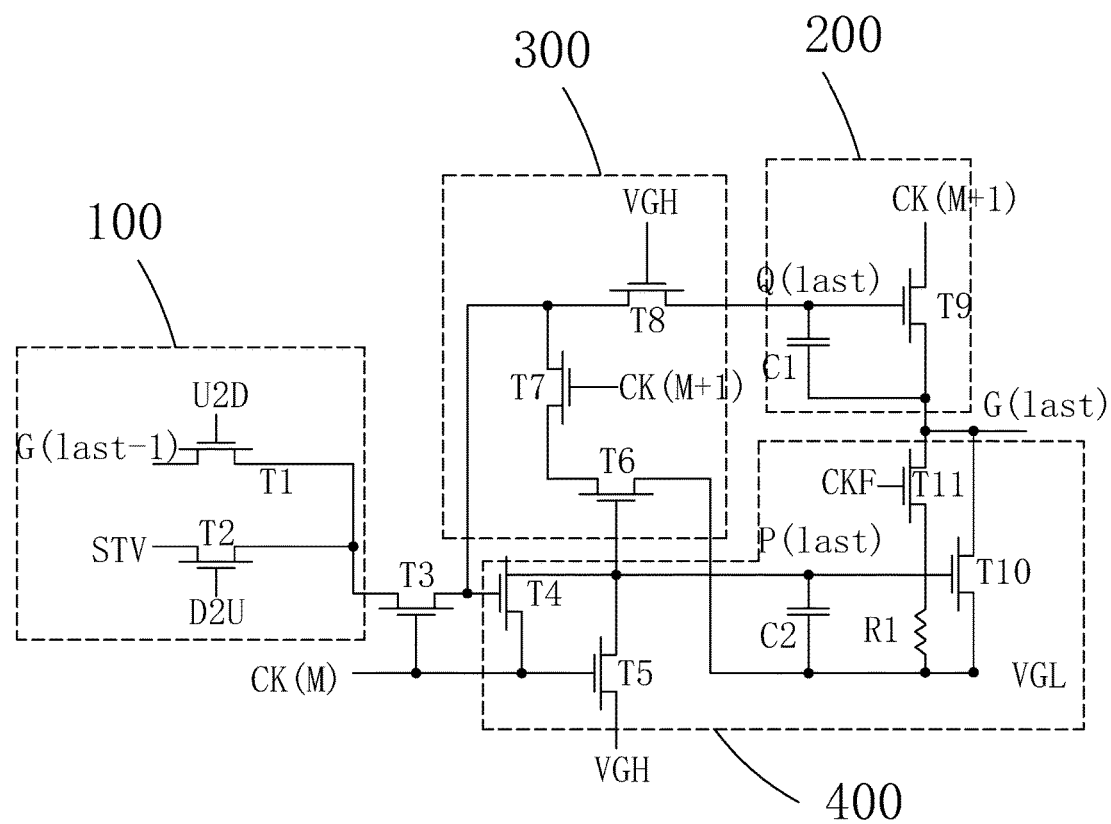
FIG. 5 is a circuit diagram of a GOA unit of the last stage in the GOA circuit of reducing feed-through voltage according to the present invention.

Particularly, referring to FIG. 4 and FIG. 5, in the GOA unit of the first stage, the source of the first thin film transistor T1 is electrically coupled to a start signal STV; in the GOA unit of the last stage, the source of the second thin film transistor T2 is electrically coupled to a start signal STV.

Specifically, the thin film transistors are all N type LTPS semiconductor thin film transistors.

The clock signal comprises two clock signals: a first clock signal CK(1) and a second clock signal CK(2); as the Mth clock signal CK(M) is the first clock signal CK(1), the M+1th clock signal CK(M+1) is the second clock signal CK(2); as the Mth clock signal CK(M) is the second clock signal CK(2), the M+1th clock signal CK(M+1) is the first clock signal CK(1).

The output control signal CKF is a pulse signal, of which a period is ½ of a clock signal period. In one period of the output control signal CKF, a rising edge of the output control signal CKF is generated at a high voltage level phase of the M+1th clock signal CK(M+1), and a falling edge is generated simultaneously with a falling edge of the M+1th clock signal CK(M+1).

Furthermore, a high voltage level of the M+1th clock signal CK(M+1) and a voltage level of the constant high voltage level VGH are the same. A voltage level of the first falling edge of a signal waveform outputted by the output end G(n) is dropped between the constant high voltage level VGH and the constant low voltage level VGL, and a voltage level of the second falling edge is dropped to the constant low voltage level VGL. Thereby, the voltage difference before and after the gate of the TFT in the pixel can be decreased to reduce the feed-through voltage and raise the display uniformity of the liquid crystal panel. A channel width to length ratio (W/L) of the eleventh thin film transistor T11 and a resistance of the first resistor R1 can be adjusted to control a voltage level that the first falling edge of the signal waveform outputted by the output end G(n) drops to.

Significantly, the GOA circuit of reducing feed-through voltage according to the present invention can achieve forward scan, and can achieve backward scan, too. As performing forward scan, the forward scan control signal U2D provides high voltage level, and the backward scan control signal D2U provides low voltage level; as performing backward scan, the forward scan control signal U2D provides low voltage level, and the backward scan control signal D2U provides high voltage level. The process of backward scan is similar with the forward scan but merely the scan directions are different. Forward scan starts scan from the GOA unit of the first stage to the GOA unit of the last stage in sequence. The backward scan starts scan from the GOA unit of the last stage to the GOA unit of the first stage in sequence.

The forward scan is illustrated below for explanation of the working process of the GOA circuit of reducing feed-through voltage according to the present invention:

at the first stage, the output end G(n−1) of the n−1th GOA unit and the Mth clock signal CK(M) provides high voltage levels, and the output control signal CKF and the M+1th clock signal CK(M+1) provides low voltage levels, and the first, the third and the fifth thin film transistors T1, T3, T5 are activated, and the eighth thin film transistor T8 is controlled by the constant high voltage level VGH to be activated all the time, and the second, the seventh and the eleventh thin film transistors T2, T7, T11 are deactivated, and the first node Q(n) is charged to high voltage level, and the fourth thin film transistor T4 controlled by the first node Q(n) is activated, and the second node P(n) is charged to high voltage level, and the tenth thin film transistor T10 is activated, and the output end G(n) outputs the constant low voltage level VGL.

at the second stage, the output end G(n−1) of the n−1th GOA unit and the Mth clock signal CK(M) are changed to be low voltage levels, and the M+1th clock signal CK(M+1) provides high voltage level, and the output control signal CKF provides low voltage level, and the third, the fifth thin film transistors T3, T5 are deactivated, and the seventh thin film transistor T7 is activated, and the first node Q(n) is kept to be high voltage level with the function of the first capacitor C1, and the fourth thin film transistor T4 remains to be activated to pull down the voltage level of the second node P(n) to low voltage level, and the sixth, the tenth thin film transistors T6, T10 are deactivated, and the ninth thin film transistor T9 remains to be activated, and the output end G(n) outputs the high voltage level of the M+1th clock signal CK(M+1), which is equal to the high voltage level of the constant high voltage level VGH;

at the third stage, both the M+1th clock signal CK(M+1) and the output control signal CKF provide high voltage level, and both the n−1th GOA unit and the Mth clock signal CK(M) provide low voltage levels, and the eleventh thin film transistor T11 is controlled by the output control signal CKF to be activated, and under the voltage division function of the first resistor R1, the first falling edge is formed, and the voltage level of the falling edge is dropped between the constant high voltage level VGH and the constant low voltage level VGL, which can be controlled by adjusting the channel width to length ratio of the eleventh thin film transistor T11 and the resistance of the first resistor R1.

At the fourth stage, the Mth clock signal CK(M) provides high voltage level again, and the output end G(n−1) of the n−1th GOA unit, the output control signal CKF and the M+1th clock signal CK(M+1) provide low voltage levels, and the third, the fifth thin film transistors T3, T5 are activated, and the second node P(n) is charged to be high voltage level, and the first node is dropped to be low voltage level, and the ninth, the eleventh thin film transistors T9, T11 are both deactivated, and the tenth thin film transistor T10 is activated, and the output end G(n) outputs the constant low voltage level VGL to form the second falling edge.

At the fifth stage, the M+1th clock signal CK(M+1) provides high voltage level again, and the output end G(n−1) of the n−1th GOA unit, the output control signal CKF and the Mth clock signal CK(M) provide low voltage levels, and the third, the fourth, the fifth, the ninth, the eleventh thin film transistors T3, T4, T5, T9, T11 are all deactivated, and the second node P(n) is acted by the function of the second capacitor C2 to be kept at high voltage level, and the sixth, the seventh, the tenth thin film transistors T6, T7, T10 are all activated to keep the low voltage levels of the first node Q(n) and the output end G(n).

Figure 1:
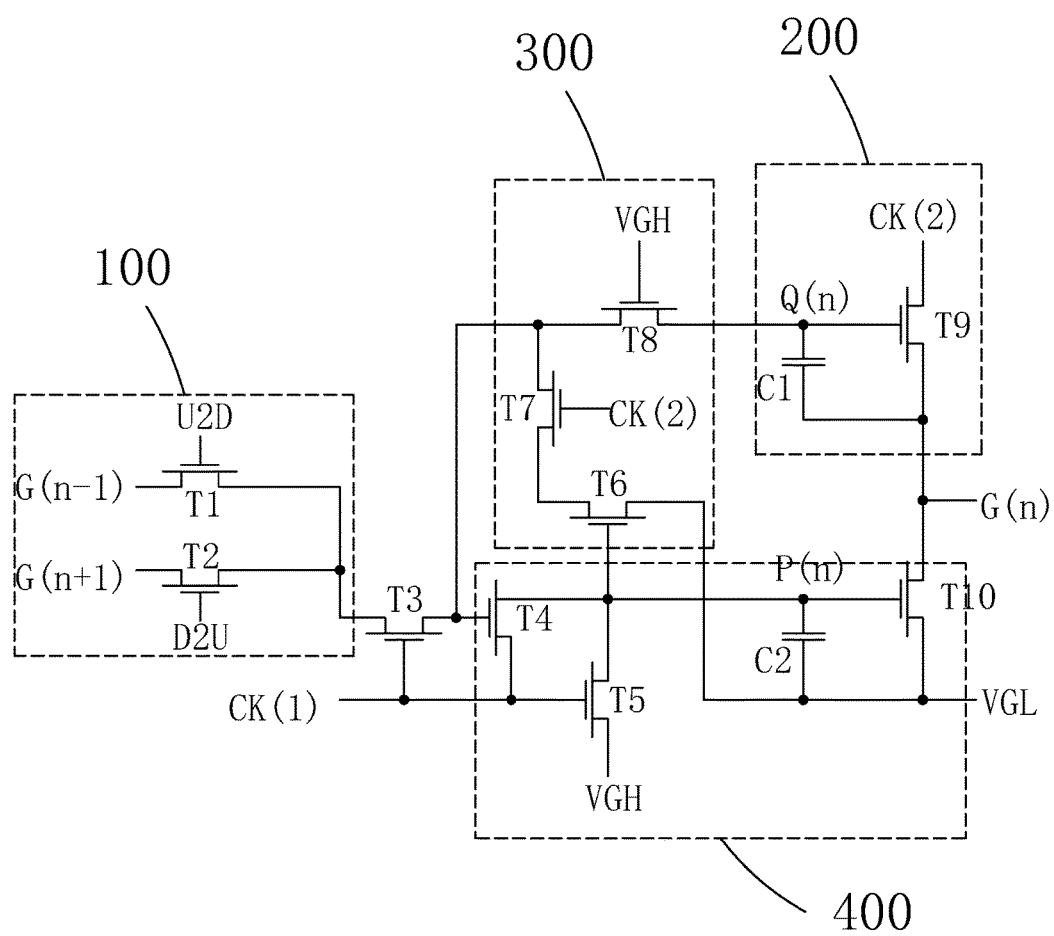
FIG. 1 is a common GOA circuit according to prior art.
Figure 2:
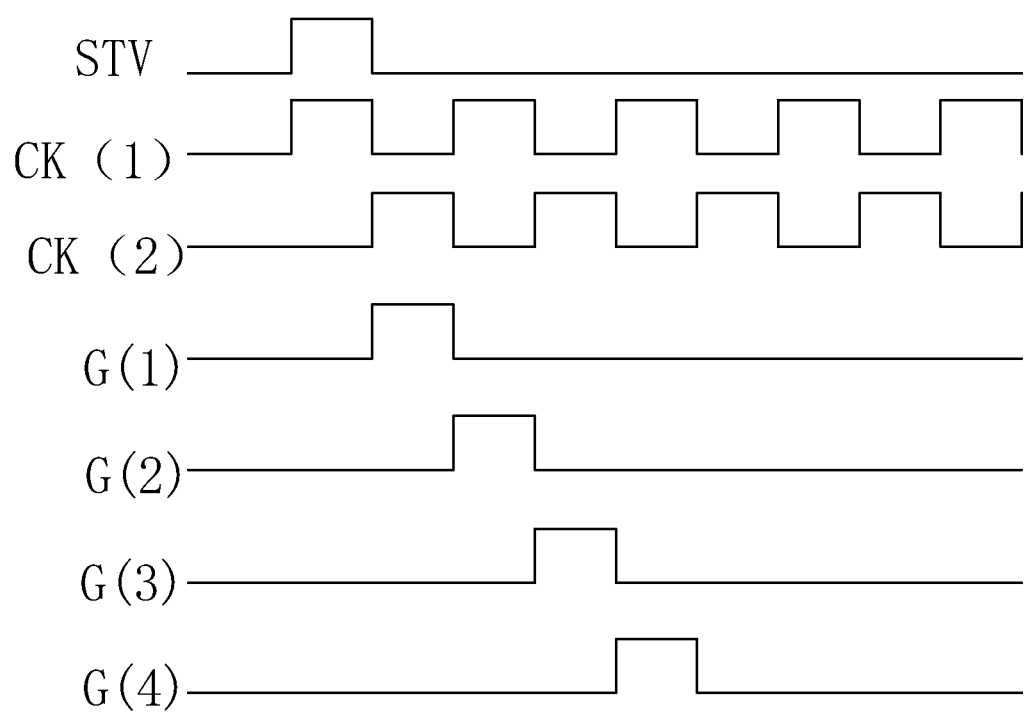
FIG. 2 is a sequence diagram of the GOA circuit shown in FIG. 1.

The known calculation formula of the feed-through voltage is:

$$V = Cgd \times (Vg1 - Vg2) / (Cgs + Clc + Cst) \quad (1)$$

wherein V is the feed-through voltage, and Vgd is a capacitor between the gate and the drain of the thin film transistor in the pixel, and Clc is the liquid crystal capacitor of the pixel, and Cst is the storage capacitor of the pixel; Vg1 is the gate voltage before the gate of the thin film transistor in the pixel is off, i.e. the voltage of the output end of the GOA circuit. As regarding the constant high voltage level VGH in the GOA circuit according to prior art shown in FIG. 1 but for GOA circuit of the present invention, the first falling edge of the waveform outputted by the output end G(n) is dropped to the voltage level between the constant high voltage level VGH and the constant low voltage level VGL; Vg2 is the gate voltage after the gate of the thin film transistor in the pixel is off, which is the constant low voltage level VGL either for the GOA circuit according to prior art shown in FIG. 1 and the GOA circuit of the present invention. Compared with prior art, the GOA circuit of the present invention decreases the difference between Vg1 and Vg2. According to the aforesaid formula (1), the difference between Vg1 and Vg2 decreases, and the feed-through voltage drops, accordingly.

In conclusion, in the GOA circuit of reducing feed-through voltage according to the present invention, an eleventh thin film transistor and a first capacitor coupled to the eleventh thin film transistor in series are added in a pull-down output unit. In the output process of the GOA circuit, the eleventh thin film transistor is activated with the added output control signal. With the voltage division function of the first resistor, one more falling edge is generated to the waveform outputted by the output end. Namely, the waveform outputted by the output end comprises two falling edges. Thereby, the voltage difference before and after the gate of the TFT in the pixel can be decreased to reduce the feed-through voltage and raise the display uniformity of the liquid crystal panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit of reducing feed-through voltage, comprising a plurality of GOA units, which are cascade coupled, and the GOA unit of each stage comprises: a forward-backward scan control unit, a pull-up output unit, a first node pull-down unit, a pull-down output unit and a third thin film transistor;

n is set to be a positive integer, and except the GOA unit of the first and last stages, in the GOA unit of the nth stage:

the forward-backward scan control unit comprises: a first thin film transistor, and a gate of the first thin film transistor is electrically coupled to a forward scan control signal, and a source is electrically coupled to an output end of a n−1th GOA unit of the former stage, and a drain is electrically coupled to a source of the third thin film transistor; and a second thin film transistor, a gate of the second thin film transistor is electrically coupled to a backward scan control signal, and a source is electrically coupled to an output end of a n+1th GOA unit of the latter stage, and a drain is electrically coupled to the source of the third thin film transistor;

a gate of the third thin film transistor is electrically coupled to a Mth clock signal, and the source is electrically coupled to the drain of the first thin film transistor and the drain of the second thin film transistor, and a drain is electrically coupled to a gate of a fourth thin film transistor;

the pull-up output unit comprises: a ninth thin film transistor, and a gate of the ninth thin film transistor is electrically coupled to a first node, and a source is electrically coupled to a M+1th clock signal, and a drain is electrically coupled to an output end; and a first capacitor, one end of the first capacitor is electrically coupled to the first node, and the other end is electrically coupled to the output end;

the pull-down output unit comprises: a fourth thin film transistor, and a gate of the fourth thin film transistor is electrically coupled to the drain of the third thin film transistor, and a drain is electrically coupled to a second node, and a source is electrically coupled to the Mth clock signal; a fifth thin film transistor, and a gate of the fifth thin film transistor is electrically coupled to the Mth clock signal, and a drain is electrically coupled to the second node, and a source is electrically coupled to a constant high voltage level; a tenth thin film transistor, and a gate of the tenth thin film transistor is electrically coupled to the second node, and a drain is electrically coupled to the output end, and a source is electrically coupled to a constant low voltage level; an eleventh thin film transistor, and a gate of the eleventh thin film transistor is electrically coupled to an output control signal, and a drain is electrically coupled to the output end, and a source is electrically coupled to one end of a first resistor; the first resistor, the other end of the first resistor is electrically coupled to the constant low voltage level, and a second capacitor, and one end of the second capacitor is electrically coupled to the second node, and the other end is electrically coupled to the constant low voltage level;

the first node pull-down unit comprises: a sixth thin film transistor, and a gate of the sixth thin film transistor is electrically coupled to the second node, and a source is electrically coupled to a drain of a seventh thin film transistor, and a drain is electrically coupled to the constant low voltage level; the seventh thin film transistor, and a gate of the seventh thin film transistor is electrically coupled to the M+1th clock signal, and a source is electrically coupled to the drain of the third thin film transistor, and a drain is electrically coupled to the source of the sixth thin film transistor; and an eighth thin film transistor, and a gate of the eighth thin film transistor is electrically coupled to the constant high voltage level, and a source is electrically coupled to the drain of the third thin film transistor, and a source is electrically coupled to the first node;

the output control signal is a pulse signal, of which a period is ½ of a clock signal period;

a signal waveform outputted by the output end comprises two falling edges.

2. The GOA circuit of reducing feed-through voltage according to claim 1, wherein in the GOA unit of the first stage, a source of the first thin film transistor is coupled to a circuit start signal.

3. The GOA circuit of reducing feed-through voltage according to claim 1, wherein in the GOA unit of the last stage, a source of the second thin film transistor is electrically coupled to a start signal.

4. The GOA circuit of reducing feed-through voltage according to claim 1, wherein as the forward scan control signal provides high voltage level, and the backward scan control signal provides low voltage level, the GOA circuit performs forward scan, and as the forward scan control signal provides low voltage level, and the backward scan control signal provides high voltage level, the GOA circuit performs backward scan.

5. The GOA circuit of reducing feed-through voltage according to claim 1, wherein the clock signal comprises two clock signals: a first clock signal and a second clock signal; as the Mth clock signal is the first clock signal, the M+1th clock signal is the second clock signal; as the Mth clock signal is the second clock signal, the M+1th clock signal is the first clock signal.

6. The GOA circuit of reducing feed-through voltage according to claim 1, wherein in one period of the output control signal, a rising edge of the output control signal is generated at a high voltage level phase of the M+1th clock signal, and a falling edge is generated simultaneously with a falling edge of the M+1th clock signal.

7. The GOA circuit of reducing feed-through voltage according to claim 1, wherein a high voltage level of the M+1th clock signal and a voltage level of the constant high voltage level are the same.

8. The GOA circuit of reducing feed-through voltage according to claim 7, wherein a voltage level of the first falling edge of a signal waveform outputted by the output end is dropped between the constant high voltage level and the constant low voltage level.

9. The GOA circuit of reducing feed-through voltage according to claim 8, wherein a channel width to length ratio of the eleventh thin film transistor and a resistance of the first resistor are adjusted to control a voltage level that the first falling edge of the signal waveform outputted by the output end drops to.

10. The GOA circuit of reducing feed-through voltage according to claim 1, wherein the thin film transistors are all N type LTPS semiconductor thin film transistors.

11. A GOA circuit of reducing feed-through voltage, comprising a plurality of GOA units, which are cascade coupled, and the GOA unit of each stage comprises: a forward-backward scan control unit, a pull-up output unit, a first node pull-down unit, a pull-down output unit and a third thin film transistor;

n is set to be a positive integer, and except the GOA unit of the first and last stages, in the GOA unit of the nth stage:

the forward-backward scan control unit comprises: a first thin film transistor, and a gate of the first thin film transistor is electrically coupled to a forward scan control signal, and a source is electrically coupled to an output end of a n−1th GOA unit of the former stage, and a drain is electrically coupled to a source of the third thin film transistor; and a second thin film transistor, a gate of the second thin film transistor is electrically coupled to a backward scan control signal, and a source is electrically coupled to an output end of a n+1th GOA unit of the latter stage, and a drain is electrically coupled to the source of the third thin film transistor;

a gate of the third thin film transistor is electrically coupled to a Mth clock signal, and the source is electrically coupled to the drain of the first thin film transistor and the drain of the second thin film transistor, and a drain is electrically coupled to a gate of a fourth thin film transistor;

the pull-up output unit comprises: a ninth thin film transistor, and a gate of the ninth thin film transistor is electrically coupled to a first node, and a source is electrically coupled to a M+1th clock signal, and a drain is electrically coupled to an output end; and a first capacitor, one end of the first capacitor is electrically coupled to the first node, and the other end is electrically coupled to the output end;

the pull-down output unit comprises: a fourth thin film transistor, and a gate of the fourth thin film transistor is electrically coupled to the drain of the third thin film transistor, and a drain is electrically coupled to a second node, and a source is electrically coupled to the Mth clock signal; a fifth thin film transistor, and a gate of the fifth thin film transistor is electrically coupled to the Mth clock signal, and a drain is electrically coupled to the second node, and a source is electrically coupled to a constant high voltage level; a tenth thin film transistor, and a gate of the tenth thin film transistor is electrically coupled to the second node, and a drain is electrically coupled to the output end, and a source is electrically coupled to a constant low voltage level; an eleventh thin film transistor, and a gate of the eleventh thin film transistor is electrically coupled to an output control signal, and a drain is electrically coupled to the output end, and a source is electrically coupled to one end of a first resistor; the first resistor, the other end of the first resistor is electrically coupled to the constant low voltage level, and a second capacitor, and one end of the second capacitor is electrically coupled to the second node, and the other end is electrically coupled to the constant low voltage level;

the first node pull-down unit comprises: a sixth thin film transistor, and a gate of the sixth thin film transistor is electrically coupled to the second node, and a source is electrically coupled to a drain of a seventh thin film transistor, and a drain is electrically coupled to the constant low voltage level; the seventh thin film transistor, and a gate of the seventh thin film transistor is electrically coupled to the M+1th clock signal, and a source is electrically coupled to the drain of the third thin film transistor, and a drain is electrically coupled to the source of the sixth thin film transistor; and an eighth thin film transistor, and a gate of the eighth thin film transistor is electrically coupled to the constant high voltage level, and a source is electrically coupled to the drain of the third thin film transistor, and a source is electrically coupled to the first node;

the output control signal is a pulse signal, of which a period is ½ of a clock signal period;

a signal waveform outputted by the output end comprises two falling edges;

wherein in the GOA unit of the first stage, the source of the first thin film transistor is electrically coupled to a start signal;

wherein in the GOA unit of the last stage, the source of the second thin film transistor is electrically coupled to a start signal;

wherein as the forward scan control signal provides high voltage level, and the backward scan control signal provides low voltage level, the GOA circuit performs forward scan, and as the forward scan control signal provides low voltage level, and the backward scan control signal provides high voltage level, the GOA circuit performs backward scan.

12. The GOA circuit of reducing feed-through voltage according to claim 11, wherein the clock signal comprises two clock signals: a first clock signal and a second clock signal; as the Mth clock signal is the first clock signal, the M+1th clock signal is the second clock signal; as the Mth clock signal is the second clock signal, the M+1th clock signal is the first clock signal.

13. The GOA circuit of reducing feed-through voltage according to claim 11, wherein in one period of the output control signal, a rising edge of the output control signal is generated at a high voltage level phase of the M+1th clock signal, and a falling edge is generated simultaneously with a falling edge of the M+1th clock signal.

14. The GOA circuit of reducing feed-through voltage according to claim 11, wherein a high voltage level of the M+1th clock signal and a voltage level of the constant high voltage level are the same.

15. The GOA circuit of reducing feed-through voltage according to claim 14, wherein a voltage level of the first falling edge of a signal waveform outputted by the output end is dropped between the constant high voltage level and the constant low voltage level.

16. The GOA circuit of reducing feed-through voltage according to claim 15, wherein a channel width to length ratio of the eleventh thin film transistor and a resistance of the first resistor are adjusted to control a voltage level that the first falling edge of the signal waveform outputted by the output end drops to.

17. The GOA circuit of reducing feed-through voltage according to claim 11, wherein the thin film transistors are all N type LTPS semiconductor thin film transistors.

* * * * *